United States Patent
Matsuoka et al.

(10) Patent No.: US 8,406,713 B2
(45) Date of Patent: Mar. 26, 2013

(54) TRANSMISSION POWER CONTROL METHOD AND TRANSMISSION POWER CONTROL APPARATUS

(75) Inventors: Akihiko Matsuoka, Kanagawa (JP); Tomoya Urushihara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 60 days.

(21) Appl. No.: 13/148,460

(22) PCT Filed: Nov. 18, 2010

(86) PCT No.: PCT/JP2010/006777
§ 371 (c)(1),
(2), (4) Date: Aug. 8, 2011

(87) PCT Pub. No.: WO2011/070731
PCT Pub. Date: Jun. 16, 2011

(65) Prior Publication Data
US 2012/0001688 A1    Jan. 5, 2012

(30) Foreign Application Priority Data

Dec. 11, 2009  (JP) .................................. 2009-281710

(51) Int. Cl.
H04B 1/04  (2006.01)
(52) U.S. Cl. .................... 455/127.4; 455/127.1; 455/83; 455/102; 455/115.1; 455/126
(58) Field of Classification Search ............... 455/127.4, 455/83, 127.1, 115.1, 126, 102
See application file for complete search history.

(56) References Cited

U.S. PATENT DOCUMENTS

| 6,670,849 B1 * | 12/2003 | Damgaard et al. ............ 330/129 |
| 2002/0154708 A1 | 10/2002 | Rouphael |
| 2004/0219891 A1 * | 11/2004 | Hadjichristos ................ 455/102 |
| 2006/0003712 A1 * | 1/2006 | Schell ........................ 455/115.1 |

(Continued)

FOREIGN PATENT DOCUMENTS

| WO | 2008/050833 | 5/2008 |
| WO | 2008/084850 | 7/2008 |
| WO | 2008/084851 | 7/2008 |
| WO | 2008/084852 | 7/2008 |

OTHER PUBLICATIONS

International Search Report dated Dec. 21, 2010.

*Primary Examiner* — Sanh Phu
(74) *Attorney, Agent, or Firm* — Dickinson Wright PLLC

(57) ABSTRACT

When switching the mode of a power amplifier between a compressed mode and an uncompressed mode, an accurate transmission power control is realized. A transmission power control method includes calculating an intra-mode output power error from a power setting value in a mode before switching as a comparison standard value error (equal to step ST32), setting a power setting value of a mode to switch to, such that an inter-mode output power error is canceled (equal to step ST33), calculating an intra-mode output power error from a power setting value of a mode to switch to (equal to step ST35), calculating a gain linearity value based on a power setting value of a mode to switch to and the intra-mode output power error (equal to step ST36), and resetting the power setting value of the mode to switch to, that cancels the comparison standard value error in the mode before switching and the output power error in the mode to switch to, based on the gain linearity value (equal to steps ST37 and 38).

5 Claims, 13 Drawing Sheets

U.S. PATENT DOCUMENTS

| | | |
|---|---|---|
| 2008/0175306 A1 | 7/2008 | Matsuoka |
| 2008/0188189 A1 | 8/2008 | Urushihara |
| 2008/0268799 A1 | 10/2008 | McCune |
| 2009/0285329 A1 | 11/2009 | Matsuoka |

\* cited by examiner

| TPC COMMAND | TRANSMISSION POWER CONTROL RANGE | | | | | |
|---|---|---|---|---|---|---|
| | 1 dB STEP SIZE | | 2 dB STEP SIZE | | 3 dB STEP SIZE | |
| | LOWER SIDE | UPPER SIDE | LOWER SIDE | UPPER SIDE | LOWER SIDE | UPPER SIDE |
| 1 | +0.5dB | +1.5dB | +1dB | +3dB | +1.5dB | +4.5dB |
| 0 | −0.5dB | +0.5dB | −0.5dB | +0.5dB | −0.5dB | +0.5dB |
| −1 | −0.5dB | −1.5dB | −1dB | −3dB | −1.5dB | −4.5dB |

FIG.5

| TARGET STEP SIZE | STEP SIZE TOLERANCES |
|---|---|
| 0dB | +/−0.5dB |
| 1dB | +/−0.5dB ← MOST RESTRICTIVE |
| 2dB | +/−1.0dB |
| 3dB | +/−1.5dB |
| 4−10dB | +/−2.0dB |
| 11−15dB | +/−3.0dB |
| 16−20dB | +/−4.0dB |
| ≥21dB | +/−6.0dB |

FIG.6

| TPC COMMAND GROUP | TRANSMISSION POWER CONTROL RANGE AFTER 10 EQUAL TPC COMMAND GROUPS ARE PERFORMED ||||||| TRANSMISSION POWER CONTROL RANGE AFTER 7 EQUAL TPC COMMAND GROUPS ARE PERFORMED ||
|---|---|---|---|---|---|---|---|---|
| | 1 dB STEP SIZE || 2 dB STEP SIZE || 3 dB STEP SIZE ||||
| | LOWER SIDE | UPPER SIDE | LOWER SIDE | UPPER SIDE | | | LOWER SIDE | UPPER SIDE |
| +1 | +8dB | +12dB | +16dB | +24dB | | | +16dB | +26dB |
| 0 | +1dB | +1dB | -1dB | +1dB | | | -1dB | +1dB |
| -1 | -8dB | -12dB | -16dB | -24dB | | | -16dB | -26dB |
| 0,0,0,+1 | +6dB | +14dB | N/A | N/A | | | N/A | N/A |
| 0,0,0,-1 | -6dB | -14dB | N/A | N/A | | | N/A | N/A |

IN THIS TABLE, THESE REQUIREMENTS ARE MOST RESTRICTIVE (AFTER 10 EQUAL STEPS WHICH ARE EACH 1 dB ARE PERFORMED, POWER DIFFERENCE MUST BE WITHIN 10 ± 2 dB)

FIG.7

TRANSMISSION POWER CONTROL METHOD AND TRANSMISSION POWER CONTROL APPARATUS

TECHNICAL FIELD

The present invention relates to a transmission power control method and a transmission power control apparatus used for a radio device.

BACKGROUND ART

Generally, with a radio device, low power consumption and an accurate transmission power control are required. By reducing consumption power, a radio device that mounts a battery, for example, a mobile telephone is able to communicate longer. Also, by carrying out an accurate transmission power control, it is possible to increase communication quality. Absence of accurate transmission power control becomes a cause of increased noise leakage against other radio devices, so that in many cases an accurate transmission power control is strictly required by, for example, a radio communication standard.

As a preferable transmitting technology to achieve low power consumption, conventionally, a polar modulation scheme has been proposed (for example, see patent literature 1).

FIG. 1 shows an example of a typical transmission apparatus using a polar modulation scheme. The transmission apparatus has polar signal generation circuit 1, amplitude control circuit 2, phase-modulated signal generation circuit 3, and power amplifier (hereinafter "PA") 4. In this transmission apparatus, polar signal generation circuit 1 generates an amplitude component signal and a phase component signal of a modulated transmission signal from an input signal (that is, the modulated transmission signal). Amplitude control circuit 2 controls a power supply voltage to be supplied to PA 4 based on the amplitude component signal, and phase-modulated signal generation circuit 3 generates a phase-modulated signal to be input to PA 4 based on the phase component signal.

This transmission apparatus secures the dynamic range of transmission power by switching PA 4 between a compressed mode and an uncompressed mode. Further, a compressed mode may be rephrased as a saturation operation mode and an uncompressed mode as a non-saturation operation mode.

This transmission apparatus operates PA 4 in a compressed mode when high transmission power is required. On the other hand, when low transmission power is required, the transmission apparatus operates PA 4 in an uncompressed mode. Specifically, in a compressed mode, the transmission apparatus controls the output power by changing the level of the power supply voltage to PA 4 according to desired output power. Given that the PA operates in the saturation region, this compressed mode is inherently very accurate with respect to output power.

On the other hand, in an uncompressed mode, the transmission apparatus controls the output power by changing the level of the phase-modulated signal to be input to PA 4 according to desired output power. In this uncompressed mode, given that the PA operates in the linear region, the output power is not controlled as accurately as in a compressed mode.

CITATION LIST

Patent Literature

PTL 1
U.S. Patent Application Publication No. 2002/0154708

SUMMARY OF INVENTION

Technical Problem

With conventional transmission apparatuses, when a compressed mode (C-mode) and an uncompressed mode (U-mode) are switched in transmission power control, transmission power drift is likely to be produced due to differences between the characteristics of the modes (drift due to temperature, drift due to wear, and drift due to load, etc.).

This will be explained briefly using FIG. 2. As shown in FIG. 2, the output power in a compressed mode is relatively accurate, but the output power in an uncompressed mode changes due to drift (drift due to temperature, drift due to wear, and drift due to load, etc.).

As shown in FIG. 2, given that the output power in an uncompressed mode is likely to drift due to various factors, when a compressed mode and an uncompressed mode are switched, the output power is likely to be discontinuous, and, as a result, significant drift of transmission power is likely to be produced on switching a mode.

Also, even in the same mode, due to, for example, a change of temperature, an output power error from the power setting value is produced.

Particularly when switching a power amplifier between a compressed mode and an uncompressed mode and controlling output power to the target power, an inter-mode output power error from the power setting value and an intra-mode output power error from the power setting value are produced in a complex manner, so that there has been a problem that it is difficult to accurately adjust output power to the target power.

It is an object of the present invention to provide a transmission power control method and a transmission power control apparatus that perform precise transmission power control when a power amplifier is switched between a compressed mode and an uncompressed mode.

Solution to Problem

One aspect of the transmission power control method of the present invention that the transmission power control method including a process of switching a mode of a power amplifier between a compressed mode and an uncompressed mode in a process of controlling output power of the power amplifier, the method includes: calculating an intra-mode output power error from a power setting value of the mode before switching, as a comparison standard value error; setting the power setting value of a mode to switch to, such that an inter-mode output power error is canceled; calculating the intra-mode output power error from the power setting value of the mode to switch to; calculating a gain linearity value based on the power setting value of the mode to switch to and the intra-mode output power error; and resetting the power setting value in the mode to switch to that cancels, based on the gain linearity value, the comparison standard value error in the mode before switching and the output power error in the mode to switch to.

One aspect of the transmission power control method of the present invention that the transmission power control method including a process of switching a mode of a power amplifier between a compressed mode and an uncompressed mode in a process of controlling output power of the power amplifier, the method includes the steps of: setting the first and second power setting values that are power setting values in a mode before switching, measuring the first and second power measurement values that are output power measurement values of the power amplifier when the first and second power setting values are set, and measuring a drift of a second power measurement value for a second power setting value as a comparison standard value error; setting a third power setting value that is a power setting value in a mode to switch to and measuring a third power measurement value that is an output power measurement value of the power amplifier when a third power setting value is set; measuring an inter-mode output power error based on a second and third power measurement values; setting a fourth power setting value that is a value to cancel the inter-mode output power error and measuring a fourth power measurement value that is the output power measurement value of the power amplifier when a fourth power setting value is set; measuring an intra-mode output power error from the power setting value in the mode to switch to based on the third and fourth power setting values and the third and fourth power measurement values; measuring a gain linearity value based on the third and fourth power setting values and the intra-mode output power error; and setting a fifth power setting value based on a target power, the intra-mode output power error, the comparison standard value error, and the gain linearity value.

One aspect of the transmission power control method of the present invention that the transmission power control apparatus that switches a power amplifier between a compressed mode and an uncompressed mode and controls transmission power, the apparatus includes: a power setting section that sets output power of the power amplifier; a power measurement section that measures output power of the power amplifier; an error calculation section that measures an error of an output power measurement value from a power setting value based on the power setting value set by the power setting section and the output power measurement value measured by the power measurement section; and a gain linearity calculation section that calculates a gain linearity value, where: the power setting section sets first and second power setting values that are the power setting values of a mode before switching and a third power setting value that is the power setting value of a mode to switch to; the power measurement section measures a first power measurement value that is the output power measurement value of the power amplifier when the first power setting value is set, a second power measurement value that is the output power measurement value of the power amplifier when the second power setting value is set, and a third power measurement value that is the output power measurement value of the power amplifier when the third power setting value is set; the error calculation section measures an intra-mode output power error from the power setting value in the mode before switching as a comparison standard value error based on the first and second power measurement values and measures an inter-mode output power error from the power setting value based on the second and third power measurement values; the power setting section sets a fourth power setting value that is a value to cancel the inter-mode output power error; the power measurement section measures a fourth power measurement value that is the output power measurement value of the power amplifier when the fourth power setting value is set; the error calculation section measures the intra-mode output power error from the power setting value in the mode to switch to based on the third and fourth power setting values and the third and fourth power measurement values; the gain linearity calculation section measures the gain linearity value based on the third and fourth power setting values and the intra-mode output power error; and the power setting section sets a fifth power setting value based on a target power, the intra-mode output power error, the comparison standard value error, and the gain linearity value.

Advantageous Effects of Invention

The present invention can precisely adjust output power to the target power, where the mode of a power amplifier is switched between a compressed mode and an uncompressed mode, even when an inter-mode output power error from the power setting value and an intra-mode output power error from the power setting value are produced in a complex manner.

BRIEF DESCRIPTION OF DRAWINGS

FIG. 5 shows power control tolerances for each output power step size command according to the 3GPP UMTS standard;

FIG. 6 lists tolerance step sizes;

FIG. 7 shows cumulative power control tolerances for power commands in each group according to the 3GPP UMTS standard;

DESCRIPTION OF EMBODIMENTS

Embodiments of the present invention will be described in detail with reference to the accompanying drawings.

(1) OVERALL CONFIGURATION

Figure 1:
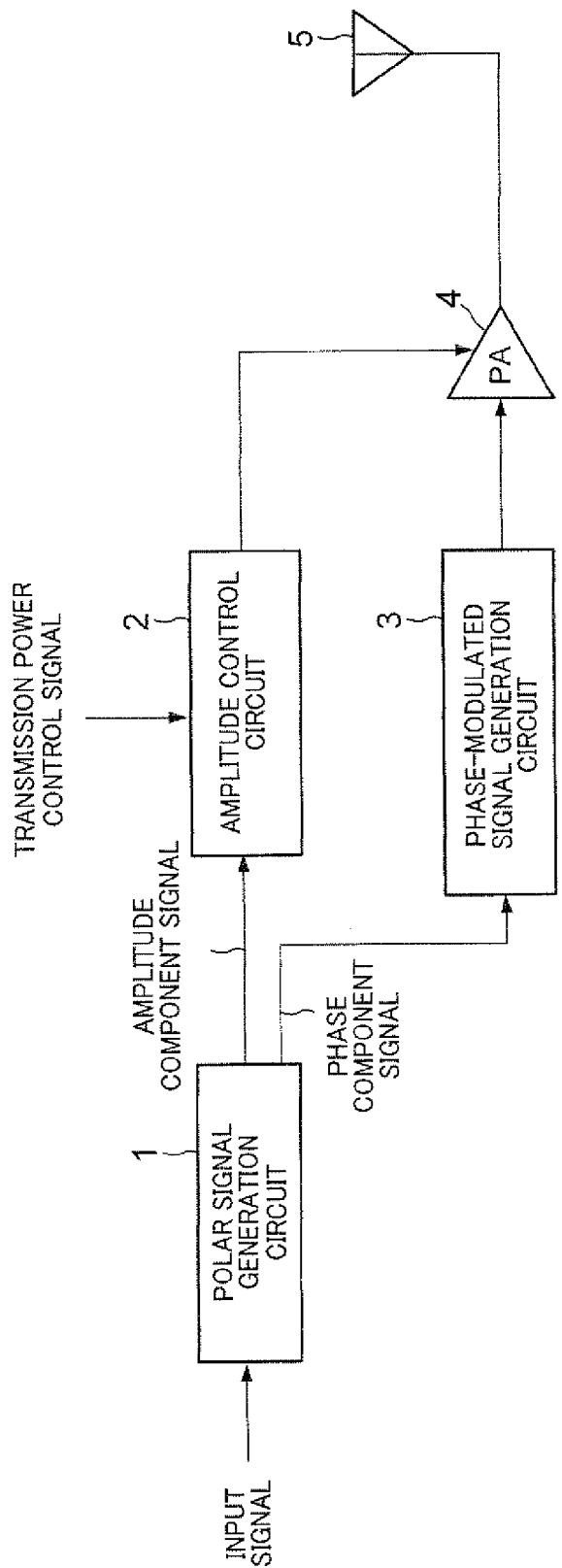
FIG. 1 is a block diagram showing an example of a typical transmission apparatus using a polar modulation scheme.
Figure 2:
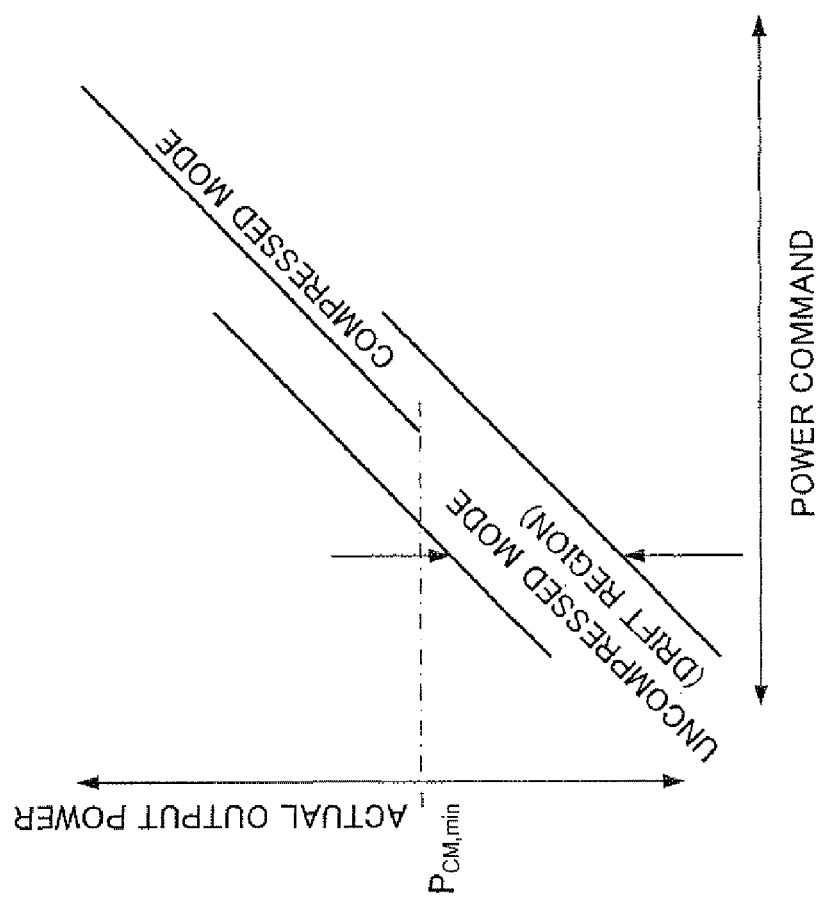
FIG. 2 shows the drift of transmission power (discontinuity in output power) resulting from a mode switch.
Figure 3:
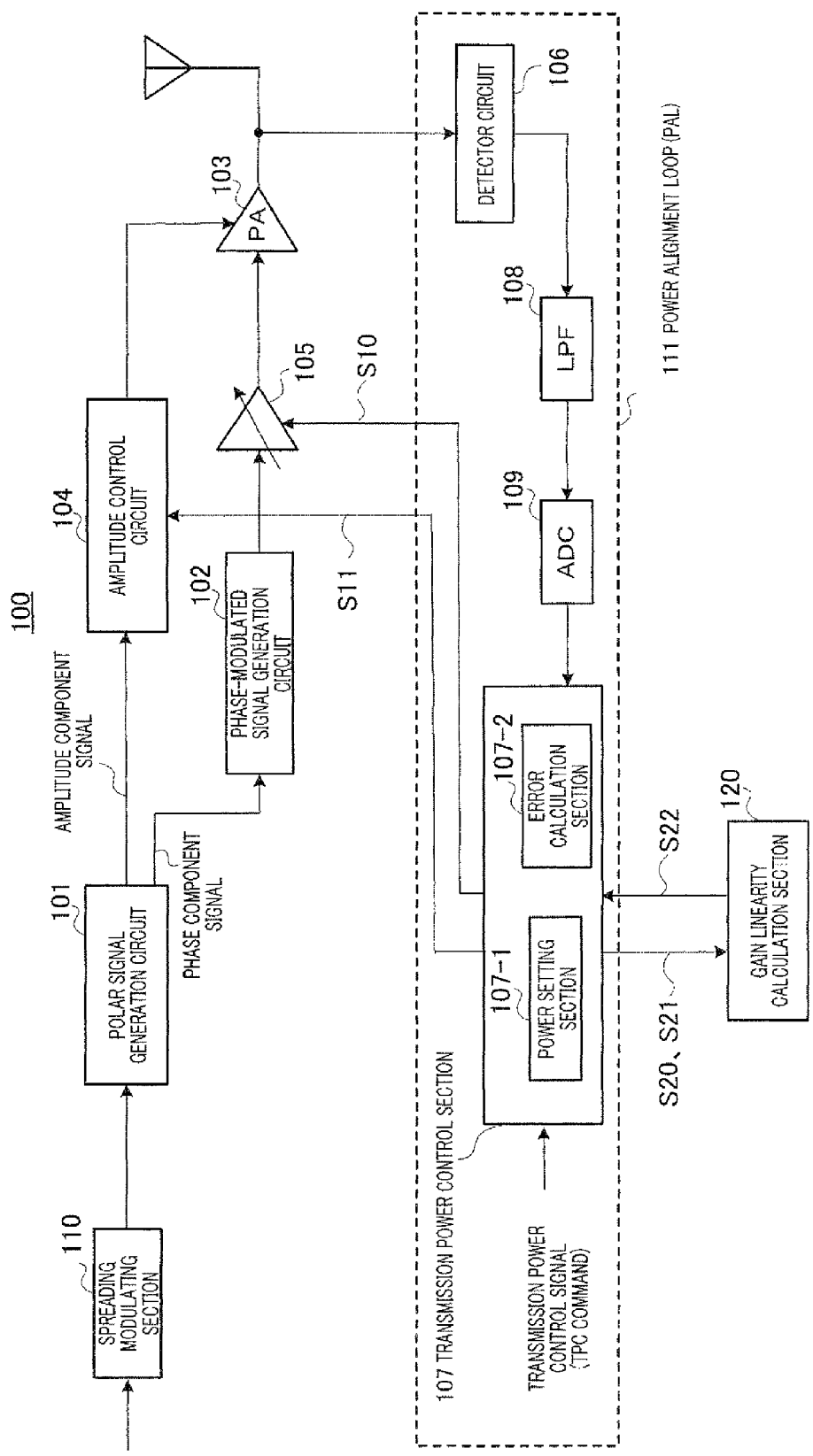
FIG. 3 is a block diagram showing a configuration of a polar modulation transmission apparatus according to the embodiment of the present invention.

FIG. 3 shows the configuration of a transmission apparatus according to an embodiment of the present invention. A case will be described with this embodiment where the present invention is applied to a transmission apparatus using a polar modulation scheme. However, the present invention is not limited to a transmission apparatus using a polar modulation scheme, but is applicable to a wide range of transmission apparatuses to control transmission power to switch a power amplifier between a compressed mode and an uncompressed mode.

Transmission apparatus 100 has polar signal generation circuit 101, phase-modulated signal generation circuit 102, power amplifier (PA) 103, amplitude control circuit 104, variable amplification circuit 105 formed with a variable gain amplifier (VGA) and/or an attenuator, and power alignment loop (PAL) 111.

PAL 111 has detector circuit 106 that detects the output power of PA 103, low-pass filter (LPF) 108, analogue-to-digital converter (ADC) 109 and transmission power control section 107. Detector circuit 106, low-pass filter (LPF) 108, and analogue-to-digital converter (ADC) 109 form a power measurement section to measure the output power of PA 103.

Polar signal generation circuit 101 receives as input a spread modulated signal (input complex signal) obtained by spreading modulating section 110. Polar signal generation circuit 101 generates an amplitude component signal and a phase component signal from the spread modulated signal as an input complex signal. Specifically, polar signal generation circuit 101 operates according to the input complex signal from spreading modulating section 110, and generates an envelope component signal (amplitude component signal) containing the amplitude information of the input complex signal, and a constant-envelope component signal (phase component signal) containing the phase information of the input complex signal. The amplitude component signal is input to amplitude control circuit 104, and the constant amplitude phase component signal is input to phase-modulated signal generation circuit 102.

Phase-modulated signal generation circuit 102 performs phase modulation using the phase component signal to generate an RF phase-modulated signal. Variable amplifier circuit 105 amplifies or attenuates an RF phase-modulated signal based on phase path scaling coefficient (phase-path magnitude scaling) S10 obtained at transmission power control section 107, and then supplies the scaled RF phase-modulated signal to the RF signal input terminal of PA 103.

Amplitude control circuit 104 forms power supply voltage for PA 103 by multiplying the amplitude component signal by an amplitude path scaling coefficient (AM-path envelope scaling) S11 from transmission power control section 107, and supplies this power supply voltage to the power supply input terminal of PA 103.

Detector circuit 106 is formed with, for example, PIN diodes or other semiconductor detectors, and detects the output power of PA 103.

LPF 108 is formed with, for example, an RC circuit and obtains an average output power value of PA 103 by integrating output power detection results from PA 103. LPF 108 is provided to reduce drift of the output power detection value of PA 103 obtained by detector circuit 106.

ADC 109 samples output results of LPF 108.

By the way, if the cut-off frequency of LPF 108 is set too high, drift cannot be reduced sufficiently. On the other hand, if the cut-off frequency is set too low, the output of LPF 108 takes time to become stable after power adjustment. Therefore, it is preferable to provide the cut-off frequency of LPF 108 taking these into consideration.

By the way, according to the 3GPP standard, power control is required to be performed within a range of ±25 μsec from the symbol boundary.

To meet this requirement, the time constant of LPF 108 needs to be on the order of several μsec or less. In practice, the time constant of LPF 108 needs to be set such that instantaneous envelope drift of a spread modulated signal can be canceled, and drift slower than the fundamental period of the spread modulated signal (the chip rate for the spreading code) resulting from the pattern of the spreading code used in spreading modulating section 110 may remain. The cut-off frequency is preferably in the range of several dozens to hundreds of kHz. In the present embodiment, as an example, the cut-off frequency is 300 kHz.

Transmission power control section 107 has power setting section 107-1 and error calculation section 107-2. Power setting section 107-1 provides the output power of PA 103. Error calculation section 107-2 calculates the error of output power measurement values from the power setting value, based on the power setting value provided by power setting section 107-1 and the output power measurement value measured by a power measurement section (detector circuit 106, LPF 108, and ADC 109).

Transmission power control section 107 receives as input the output power measurement value through detector circuit 106, LPF 108, and ADC 109. Further, transmission power control section 107 checks whether or not a transmission power control signal is reported from a communicating party (for example, a base station, but not shown), and, if a report is received, sets transmission control power value ΔP of the next symbol in the symbol boundary. Furthermore, a transmission power control signal needs not to be reported from a communicating party, and may be generated inside the terminal having a polar modulation transmission apparatus.

Power setting section 107-1 of transmission power control section 107 controls the power supply voltage level of PA 103 and the input signal (RF phase-modulated signal) level of PA 103 by calculating scaling coefficients S10 and S11 based on the output power measurement value in PA 103 and transmission power control value ΔP, and by outputting these to amplitude control circuit 104 and to variable amplification circuit 105, respectively.

Specifically, transmission power control section 107 calculates final scaling coefficients S10 and S11 by using the original values of the scaling coefficients obtained with reference to a table using the transmission power set values as addresses, and the compensation values of the scaling coefficients measured from the output power measurement values obtained by detector circuit 106, LPF 108 and ADC 109.

Transmission power control section 107 of the present embodiment has a table associating the setting value of transmission power and scaling coefficients (hereinafter referred to as the "power table").

Figure 4:
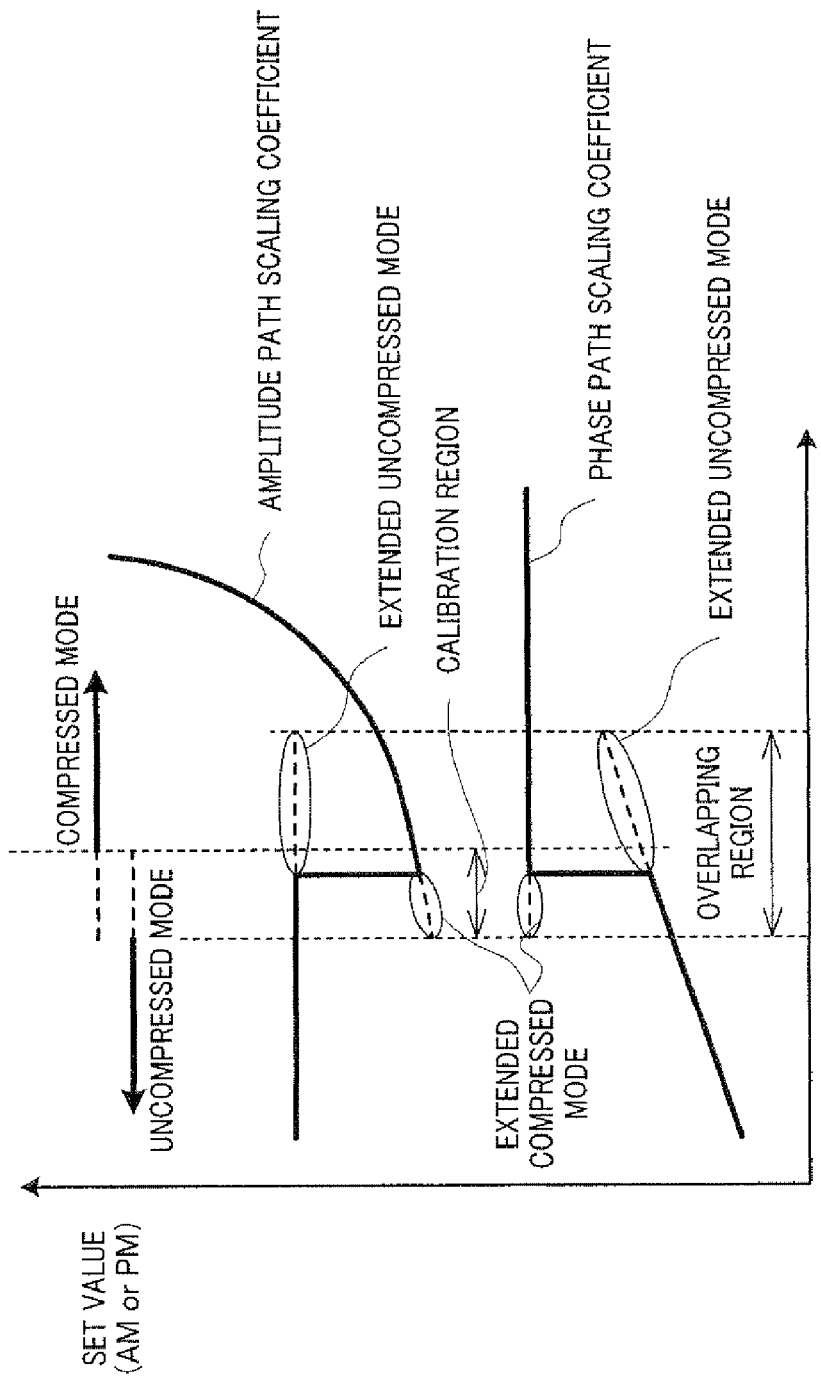
FIG. 4 shows a set of scaling coefficients provided in a transmission power control section.

FIG. 4 shows a set of scaling coefficients of the power table provided in transmission power control section 107. In a compressed mode, the output power of polar modulation transmission apparatus 100 is controlled based on the power supply voltage that is subjected to amplitude modulation and that is given to the collector (or drain) node of PA 103, while the power of the phase-modulated RF signal with a constant amplitude, is kept constant. In an uncompressed mode, the output power of PA 103 controls power by keeping constant a scaling coefficient by which the envelope of the amplitude path is multiplied and changing a scaling coefficient by which the drive signal in the phase path is multiplied. However, in either operation mode, the scaling coefficient that is not used in power control (that is, in a compressed mode, the phase path scaling coefficient by which the phase-modulated RF signal is multiplied, and, in an uncompressed mode, the amplitude path scaling coefficient by which the envelope of the amplitude path is multiplied), does not need to be kept constant, and may be adjusted to compensate for the output power or improve the output distortion characteristics or noise characteristics of PA 103.

In practice, as shown in FIG. 4, transmission power control section 107 has a set of a compressed mode scaling coefficients and a set of an uncompressed mode sealing coefficients. In ease of the present embodiment, near the boundary between a compressed mode and an uncompressed mode, an overlapping region where the set of scaling coefficients of both modes are provided.

Even though either of a compressed mode or an uncompressed mode is selected, the overlapping region is a range which can generate required output power. Specifically, in practice, by having the amplitude path scaling coefficient and phase path scaling coefficient such as shown by the solid lines in FIG. 4, a compressed mode and an uncompressed mode can be realized. However, in addition to the set of scaling coefficients shown by the solid lines, the present embodiment has the set of scaling coefficients shown by the dotted lines. Consequently, the overlapping region is provided, where the compressed mode region and the uncompressed mode region are extended to enable PA 103 to operate in either mode of a compressed mode or an uncompressed mode.

Therefore, according to scaling coefficients S10 and S11 that are calculated by power setting section 107-1 of transmission power control section 107, it is determined whether PA 103 will be operated in a compressed mode or in an uncompressed mode.

In addition to the above configuration, transmission apparatus 100 has gain linearity calculation section 120. Gain linearity calculation section 120 receives as input power adjustment amount S20 and power change amount S21 from transmission power control section 107.

The amount of power adjustment is the target amount of power adjustment provided by transmission power control section 107 to increase and decrease an output power of PA 103, that is, the difference of power setting value, in other words, the amount of power setting value. The amount of power change is the actual amount of output power of PA 103, the difference of power measurement value, in other words, the amount of power change of power measurement value, and is measured based on the output value of ADC 109. The gain linearity is the value obtained by dividing the amount of power change with the amount of power adjustment (that is, the amount of power change/the amount of power adjustment), and shows actual amount of power change of power when increasing and decreasing the power for 1 dB.

The gain linearity changes by temperature, mode, and device characteristics. If transmission power control which accurately takes into account a gain linearity is not performed, actual transmission power cannot be controlled accurately. With the present embodiment, a gain linearity is calculated by gain linearity calculation section 120. Transmission power control section 107 performs transmission power control (that is, provides a scaling coefficient) which takes into account gain linearity S22 achieved by gain linearity calculation section 120.

Therefore, transmission apparatus 100 is able to control an output power of PA 103 (that is, transmission power) to be the target value, even when a gain linearity changes due to, for example, a change of temperature.

Here, transmission apparatus 100 is required to finish power control within a time designated by, for example, the 3GPP standard. By the way, according to the 3GPP standard, power control is required to be performed within a range of ±25 μsec from the symbol boundary.

The allowed value of error of transmission power required by the 3GPP (3rd Generation Partnership Project) 25.101 will be explained using FIG. 5-FIG. 7.

3GPP, the standards body responsible for promulgating the UMTS and W-CDMA standards, requires that a mobile terminal increase or decrease output power in discrete steps (e.g., +/−1 dB, +/−2 dB, +/−3 dB, and etc.) according to TPC commands from a base station. The UMTS standard also specifies implementing these power increasing and decreasing steps within specific tolerances.

For example, as shown in the table of FIG. 5, in case of a TPC command for increasing and decreasing output power by a +/−1 dB step, the resulting output power is required to be within +/−0.5 dB of the target output power. Then, for example, if the transmission apparatus of a mobile terminal operates at 0 dBm and receives a TPC command for "1" the transmission apparatus of the mobile terminal must adjust the transmission power to be within the range between +0.5 dBm and 1.5 dBm. In the case of larger step sizes of 2 dB and 3 dB, wider tolerances of +/−1 dB and +/−1.5 dB are possible.

The 3GPP UMTS standard also specifies cumulative tolerances for power command groups, as shown in the table in FIG. 7. It is required that, for, for example, ten TPC commands each configured with 1 dB step size, the resulting output power level within +/−2 dB of the target output power level.

As shown in the list of the table of FIG. 5 and FIG. 6, the most restrictive step size for a single power control command is a power control command indicating +/−1 dB (i.e. +/−0.5 dB tolerance is required).

(2) TRANSMISSION POWER CONTROL WHICH TAKES INTO ACCOUNT COMPARISON STANDARD VALUE ERROR AND INTER-MODE AND INTRA-MODE ERRORS

Next, transmission power control which is a characteristic of the present invention and which takes into account comparison standard value error and inter-mode and intra-mode errors will be explained.

In the following explanation, for ease of explanation, transmission power control under a situation where comparison standard value error and intra-mode error (an error due to drift of gain linearity) are not produced will be explained first in item (2-1). Next, a case where an error is produced in transmission power due to comparison standard value error and intra-mode error (an error due to drift of gain linearity) will be explained in item (2-2).

Finally, transmission power control which takes into account comparison standard value error and inter-mode and intra-mode errors, according to the present embodiment will be explained in item (2-3).

In the following, a case will be explained as an example, where transmission power is controlled from a state of 8 dBm in a compressed mode to a state of 4 dBm in an uncompressed mode. Thus, a case where transmission power is decreased for 4 dB, and mode switching is performed in the decreasing process will be explained. In the following examples, a case will be explained, where an inter-mode transmission power error (an inter-mode error) on switching a mode from a compressed mode to an uncompressed mode is −2 dB.

(2-1) When Comparison Standard Value Error and Intra-Mode Error (Error Due to Drift of Gain Linearity) are not Produced Transmission power control under a situation, where gain linearity does not drift in the first place and an intra-mode error due to drift of gain linearity is not produced, will be explained using FIG. 8 and FIG. 9. In addition, a case where transmission power under a situation where comparison standard value error is not produced will be explained.

Figure 8:
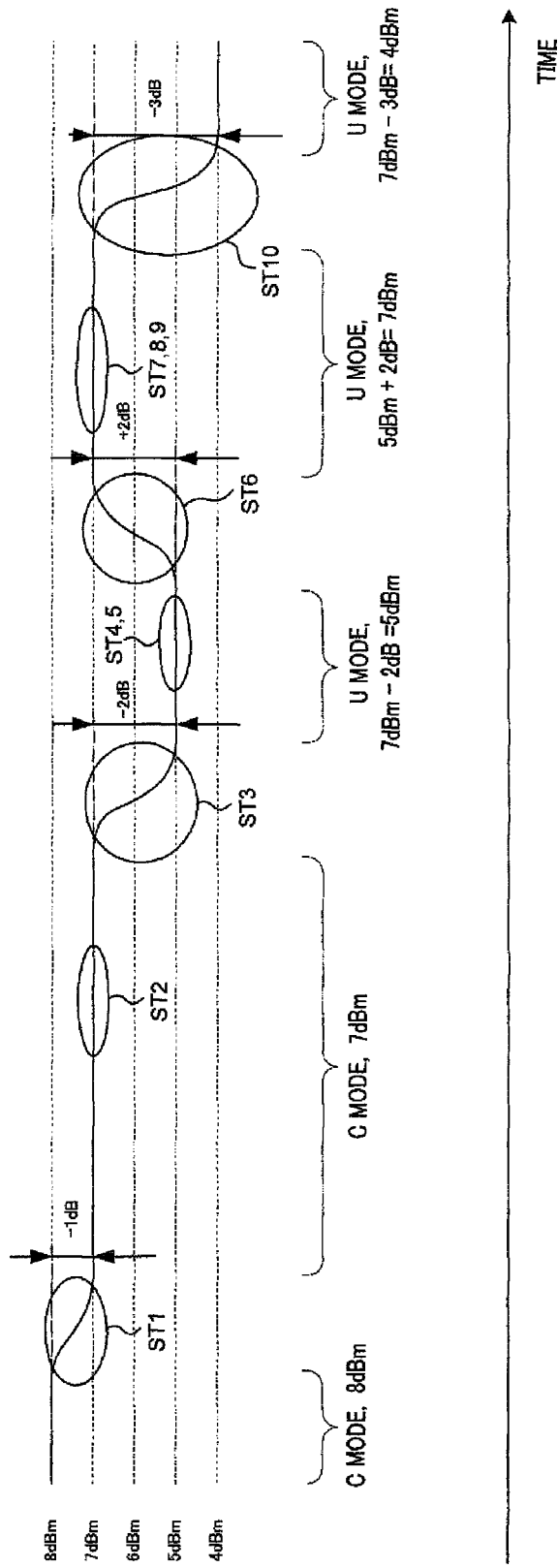
FIG. 8 shows a situation in which transmission power changes when there is no error due to drift of gain linearity.

FIG. 8 shows a changing situation of transmission power. FIG. 9 shows the transmission power control procedures performed in transmission apparatus 100. To specify how transmission power changes by performing each process step ST1-10 in FIG. 9, an interval in which each process step ST1-10 is performed is shown in FIG. 8.

Figure 9:
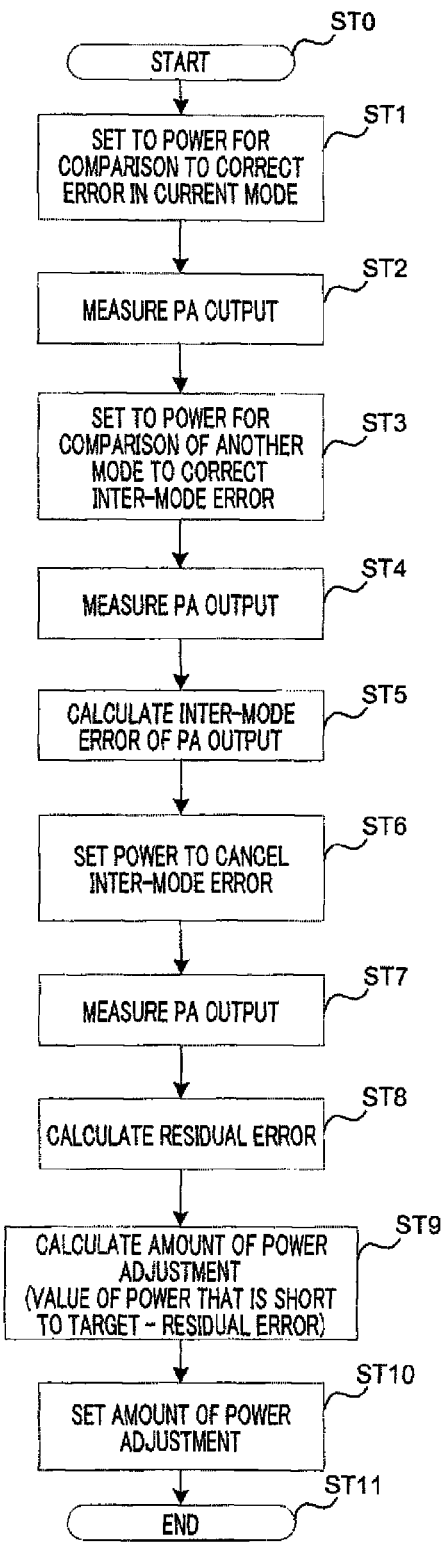
FIG. 9 is a flowchart showing transmission power control procedures when there is no error due to drift of gain linearity.

After starting transmission power control procedure in step ST0 in FIG. 9, first in step ST1, transmission apparatus 100 sets the power of PA 103 to the power for comparison (that is, provides the power setting value to the coefficient for comparison), to allow power setting section 107-1 of transmission power control section 107 to correct, in the mode before switching (a compressed mode), an error between the power setting value and the output power of actual PA 103. FIG. 8 shows an example where scaling coefficients S10 and S11, that change transmission power by −1 dB, from 8 dBm to 7 dBin, in a compressed mode, is provided and the situation where transmission power is changed by −1 dB.

In step ST2, output power of PA 103 is measured by a power measurement section (detector circuit 106, LPF 108, and ADC 109), FIG. 8 shows an example where, when the power setting value in power setting section 107-1 is 7 dBm, output power of PA 103 becomes 7 dBm, and shows a state where the error of output power (transmission power) for the power setting value is not produced. Thus, an error calculated in error calculation section 107-2 is zero.

Here, the above comparison standard value means the measurement value in step ST2. Comparison standard value error means the error (drift) of actual output power (that is, measurement value) from the change of setting power intended when step ST1 is moved to step ST2 and the setting power was changed. In an example of FIG. 8, when changing the setting power for 1 dB, the measurement value drifts for 1 dB, so that comparison standard value error is zero.

In step ST3, to allow power setting section 107-1 of transmission power control section 107 to correct the error between the power setting value and the actual output power, the power of PA 103 is set to the power for comparison in another mode (that is, the power setting value is set to a coefficient for comparison). Specifically, transmission power control section 107 provides scaling coefficients S10 and S11 that are provided to output 7 dBm in another mode (in a case of an example of FIG. 8 in an uncompressed mode).

In step ST4, output power of PA 103 is measured by a power measurement section, and in step ST5 the error of an inter-mode output power of PA 103 is calculated by error calculation section 107-2.

FIG. 8 shows an example where in step ST3, although the power setting value (scaling coefficients S10 and S11) for outputting 7 dBm power in an uncompressed mode is provided, the measured actual output power was 5 dBm. That is, the inter-mode error of −2 dB is calculated by error calculation section 107-2.

In step ST6, power setting section 107-1 provides the power setting value of an uncompressed mode, such that an inter-mode error is canceled. Thus, power setting section 107-1 provides scaling coefficients S10 and S11 which are in an uncompressed mode and which increase transmission power by 2 dB, compared with scaling coefficients S10 and S11 which are in an uncompressed mode and which are provided in step ST3.

In step ST7, output power of PA 103 is measured by a power measurement section and in an example in FIG. 8 is measured as 7 dBm. In step ST8, residual error (difference between power measurement value in step ST2 and power measurement value in step ST7) is calculated by error calculation section 107-2, and in step ST9, the amount of power adjustment, which takes into account residual error by power setting section 107-1, is calculated. The amount of power adjustment is the value of power that is short to the target, minus the residual error. FIG. 8 shows an example where the value of power that is short to the target (4 dBm) is −3 dB and the residual error is zero, so that the amount of power adjustment calculated in step ST9 becomes −3 dB. This residual error is produced due to drift of gain linearity (which may also be referred to as gain linearity error). FIG. 8 is an example in which drift of gain linearity is zero, so that residual error is also zero.

In step ST10, power setting section 107-1 sets scaling coefficients S10 and S11 corresponding to the amount of power adjustment calculated in step ST9, and transmits these to variable amplification circuit 105 and to amplitude control circuit 104, respectively. Therefore, as shown in FIG. 8, the power, 4 dBm, that is designated as the target is output from PA 103.

(2-2) When error is produced in transmission power due to comparison standard value error and intra-mode error (error due to drift of gain linearity)

Figure 10:
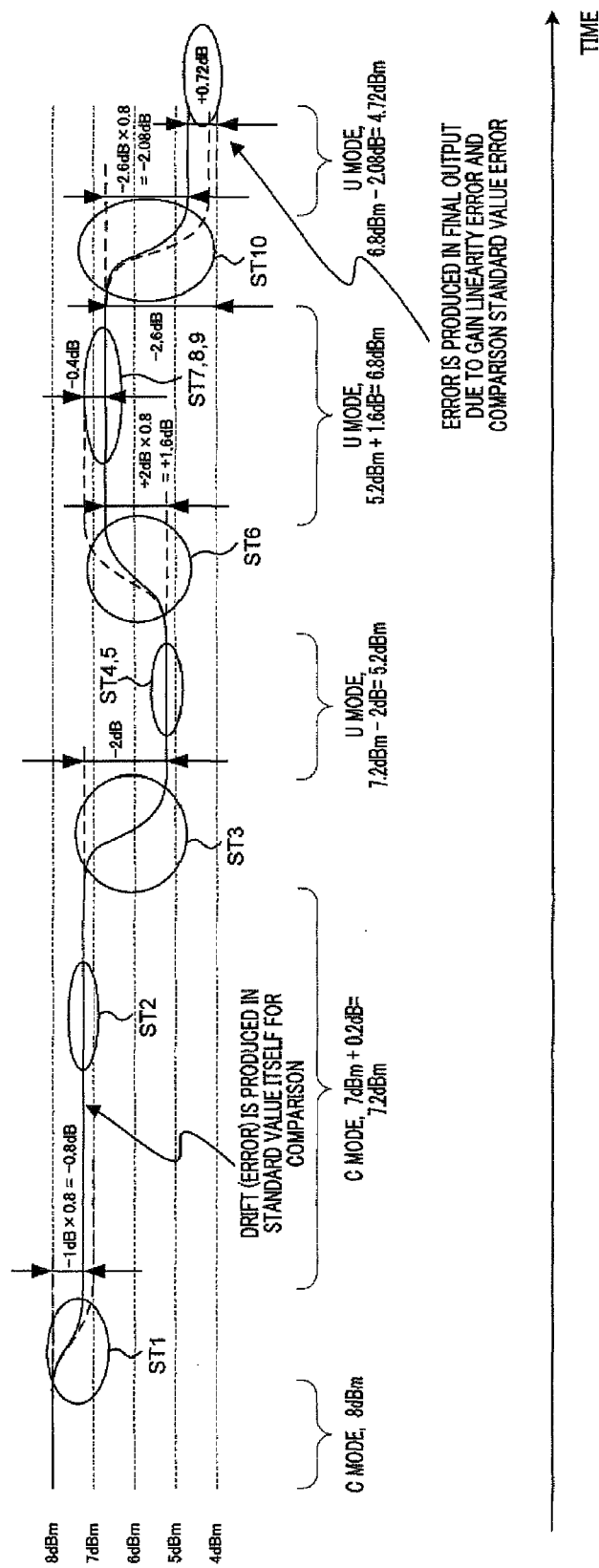
FIG. 10 shows a situation in which transmission power changes when there is an error due to drift of gain linearity.

A case shown in FIG. 10 where an error is produced in transmission power due to comparison standard value error and intra-mode error (an error due to drift of gain linearity) (that is, a case where transmission power drifts from the target) will be explained. FIG. 10 shows a changing situation of transmission power when the transmission power control procedures shown in FIG. 9 are performed. In FIG. 10, intervals are shown where each processing step ST1-10 is performed.

After starting transmission power control procedure in step ST0 in FIG. 9, first in step ST1, transmission apparatus 100 sets the power of PA 103 to the power for comparison (that is, sets the power setting value to the coefficient for comparison), to allow power setting section 107-1 to correct, in the mode before switching (a compressed mode), the error between the power setting value and the output power of actual PA 103. FIG. 10 shows an example where scaling coefficients S10 and S11, that change transmission power by −1 dB, from 8 dBm to 7 dBm, in a compressed mode, is provided and the situation where transmission power is changed by −0.8 dB.

In step ST2, output power of PA 103 is measured by a power measurement section. FIG. 10 shows an example where, when the power setting value in power setting section 107-1 is 7 dBm, output power of PA 103 becomes 7.2 dBm, and shows a state where the error of output power (transmission power) for the power setting value is produced. Thus, the comparison standard value drifts only for +0.2 dB in the plus direction. This drift of comparison standard value is measured as comparison standard value error by error calculation section 107-2.

In step ST3, to allow power setting section 107-1 of transmission power control section 107 to correct the error between the power setting value and the actual output power, the power of PA 103 is set to the power for comparison in another mode (that is, the power setting value is set to a coefficient for comparison). Specifically, power setting section 107-1 provides sealing coefficients S10 and S11 that are provided to output 7 dBm in another mode (in a case of an example of FIG. 10, in an uncompressed mode).

In step ST4, output power of PA 103 is measured by a power measurement section, and in step ST5 the error of an inter-mode output power of PA 103 is calculated by error calculation section 107-2.

FIG. 10 shows an example where in step ST3, although the power setting value (scaling coefficients S10 and S11) for outputting 7 dBm power in an uncompressed mode is provided, the measured actual output power was 5.2 dBm. Thus, an inter-mode error is 7.2 dBm–5.2 dBm=–2 dB.

In step ST6, power setting section 107-1 provides the power setting value of an uncompressed mode, such that an inter-mode error is canceled. Thus, scaling coefficients S10 and S11 which are in an uncompressed mode and which increase transmission power for 2 dB are provided, compared with scaling coefficients S10 and S11 which are in an uncompressed mode and which are provided in step ST3.

However, in an example in FIG. 10, although scaling coefficients S10 and S11 for increasing output power by 2 dB are provided, output power of PA 103 increases only 1.6 dB due to drift of gain linearity.

In step ST7 output power of PA 103 is measured by a power measurement section, in step ST8 residual error is calculated by error calculation section 107-2, and in step ST9 the amount of power adjustment which takes into account residual error is calculated by power setting section 107-1. In an example of FIG. 10, –0.4 dB is calculated as residual error, and –3 dB–(–0.4 dB)=–2.6 dB is calculated as the amount of power adjustment which takes into account residual error.

In step ST10, power setting section 107-1 sets scaling coefficients S10 and S11 corresponding to the amount of power adjustment –2.6 dB that is calculated in step ST9, and transmits these to variable amplification circuit 105 and to amplitude control circuit 104 respectively.

Here, if there is no comparison standard value error and drift of gain linearity is not produced, output power of PA 103 becomes 4 dBm, that is designated as the target. However, output power of PA 103 that should change for –2.6 dB changes only for –2.08 dB due to drift of gain linearity. In addition, the comparison standard value drifts only for +0.2 dB in the plus direction. Thus, output power of PA103 becomes 4.72 dBm. As a result, final output power of PA 103 has an error of +0.72 dB from the target value, so that it is not possible to carry out an accurate transmission power control.

Figure 11:
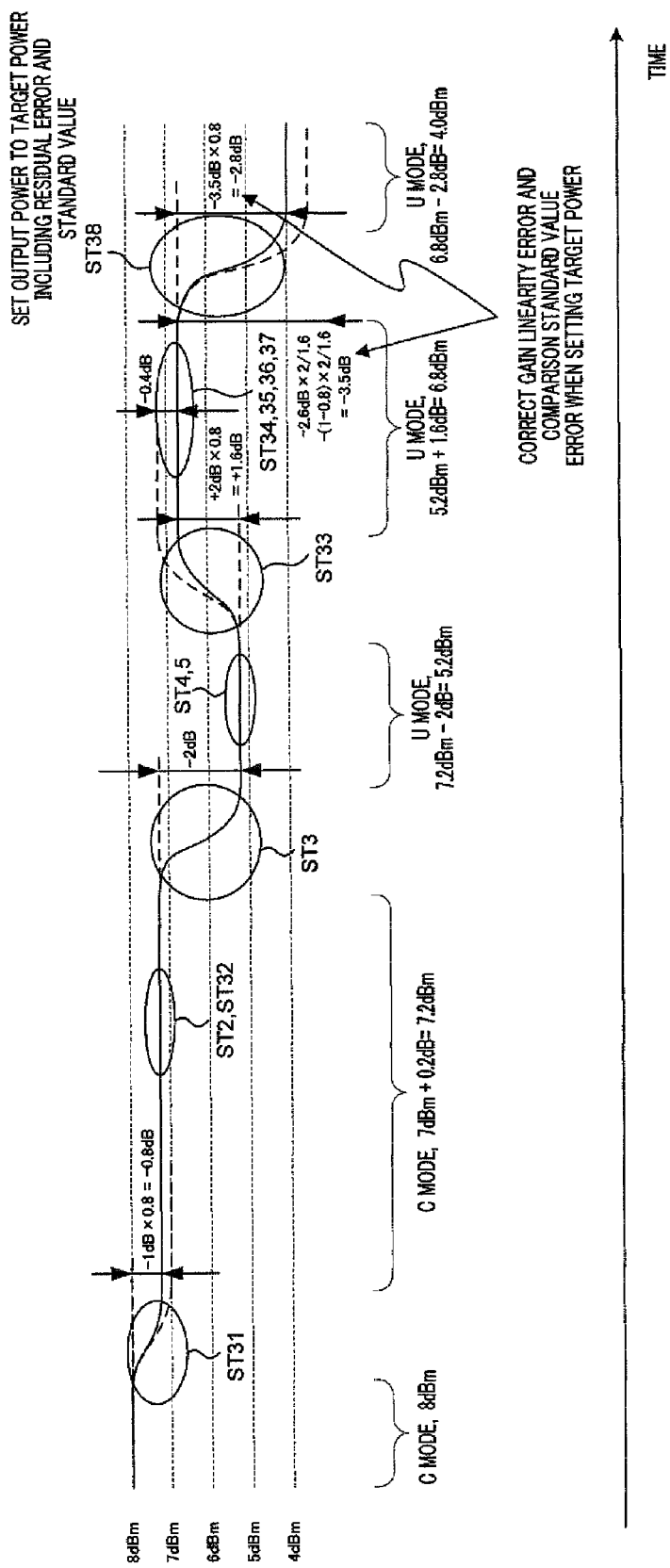
FIG. 11 shows a situation in which transmission power changes in case of a transmission power control of embodiment.
Figure 12:
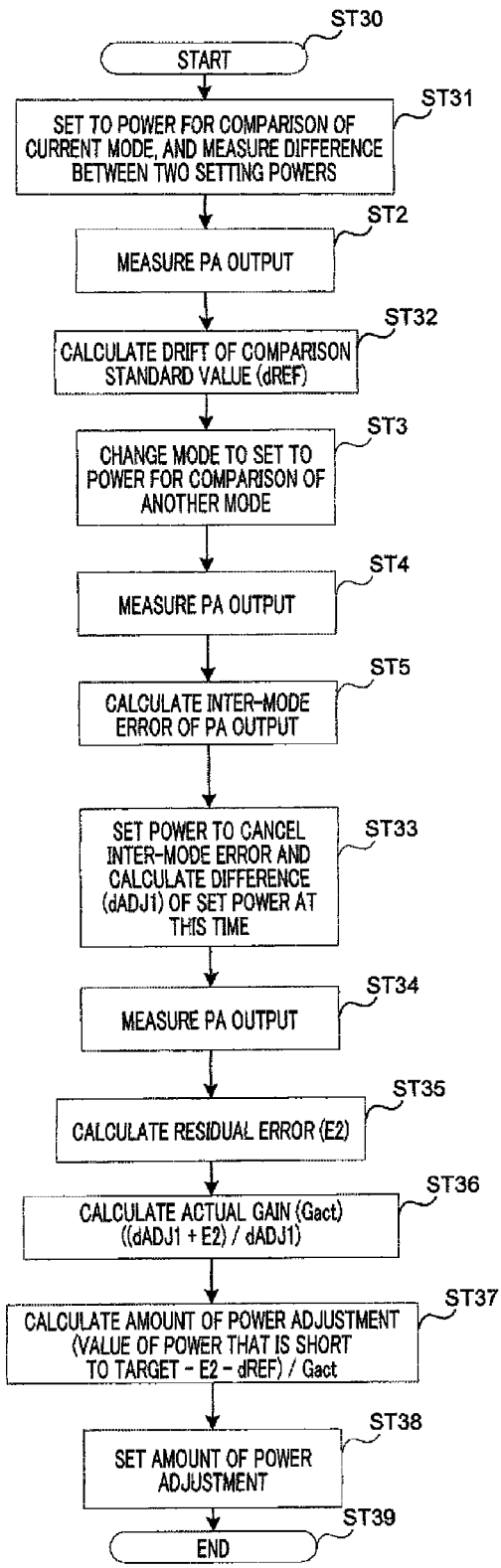
FIG. 12 is a flowchart showing the transmission power control procedures of embodiment.

(2-3) Transmission Power Control which Takes into Account Comparison Standard Value Error and Drift of Gain Linearity, According to the Present Invention Transmission power control which takes into account comparison standard value error and drift of gain linearity, according to the present embodiment will be explained using FIG. 11 and FIG. 12. FIG. 11 shows a changing situation of transmission power. FIG. 12 shows the transmission power control procedures of the present embodiment. In each step ST in FIG. 11 and FIG. 12, the steps performing the same processes as in FIG. 8 and FIG. 9 will be assigned the same reference numerals as in FIG. 8 and FIG. 9.

Once starting transmission power control procedure in step ST30 of FIG. 12, transmission apparatus 100, at first in step ST31, power setting section 107-1 sets two powers for comparison as the power setting value in the mode before switching (a compressed mode), and calculates the difference between these two setting powers. In an example of FIG. 11, the two setting powers are 8 dBm and 7 dBm, and the difference between these two setting powers is 1 dB.

In step ST2, output power of PA 103 is measured by a power measurement section, and, in step ST32, comparison standard value error (dREF) is calculated by error calculation section 107-2. FIG. 11 shows an example where, when the power setting value in power setting section 107-1 is 7 dBm, output power of PA 103 becomes 7.2 dBm, and shows a state where the error of output power (transmission power) from the power setting value is produced. Thus, the comparison standard value drifts only for +0.2 dB in the plus direction. This drift of comparison standard value is calculated as comparison standard value error in step ST32.

In step ST3, to allow power setting section 107-1 to correct the error between the power setting value and the actual output power, the power of PA 103 is set to the power for comparison in another mode (that is, the power setting value is set to a coefficient for comparison). Specifically, power setting section 107-1 provides scaling coefficients S10 and S11 that are provided to output 7 dBm in another mode (in a case of an example of FIG. 11, in an uncompressed mode).

In step ST4, output power of PA 103 is measured by a power measurement section, and in step ST5 the error of an inter-mode output power of PA 103 is calculated by error calculation section 107-2.

FIG. 11 shows an example where in step ST3, although the power setting value (scaling coefficients S10 and S11) for outputting 7 dBm power in an uncompressed mode is provided, the measured actual output power was 5.2 dBm. Thus, an inter-mode error is 7.2 dBm–5.2 dBm=–2 dB.

With transmission apparatus 100, in step ST33, power setting section 107-1 provides the power setting value in an uncompressed mode, such that an inter-mode output power error is canceled. Additionally, in the present embodiment, the difference, dADJ1, of the power setting value of this time is calculated in step ST33. In an example of FIG. 11, the difference dADJ1 of the power setting value is 2 dB.

In step ST34, output power of PA 103 is measured by a power measurement section, and, in step ST35, residual error E2 is calculated by error calculation section 107-2. In an example in FIG. 11, residual error E2=–0.4 dB holds.

In step ST36, gain linearity Gact is calculated by gain linearity calculation section 120 based on difference dADJ1 of the power setting value and residual error E2. Specifically, gain linearity calculation section 120 calculates gain linearity Gact according to the following equation.

$$Gact = (dADJ1+E2)/dADJ1 \quad \text{(Equation 1)}$$

FIG. 11 shows an example where Gact=(2+(–0.4))/2=1.6/2=0.8. Thus, in step ST36, gain linearity Gact is 0.8, and a case where, when the power setting value is increased or decreased for 1 dB, the actual output power of PA 103 is calculated to increase or decrease for 0.8 dB.

In step ST37, power setting section 107-1 calculates the amount of power adjustment which takes into account gain linearity Gact and comparison standard value error, in addition to residual error. Although with step ST9 (FIG. 9) of item (2-2) the amount of power adjustment that takes into account residual error is calculated, with the present embodiment, the amount of power adjustment that takes into account residual error, gain linearity Gact, and comparison standard value error, not residual error alone is calculated. Specifically, power setting section 107-1 calculates the amount of power adjustment by the following equation.

$$\text{Power adjustment amount} = (\text{Value of power that is short to target} - E2 - dREF)/Gact \quad \text{(Equation 2)}$$

"Value of power that is short to target" in equation 2 is not the actual value of power that is short to the target, but the value of power that is short to the target at the step of providing the power setting value. Here, a numerator in equation 2 is calculated to remove current residual error E2 from the value of power that is short to the target at the step of providing the power setting value and further reflect comparison standard value error dREF (that is, the actual value of power that is short to the target is calculated by calculation of numerator of equation 2).

In an example of FIG. 11, value of power that is short to target is "−3", residual error E2 is "−0.4", and comparison standard value error is "0.2". Thus, power adjustment amount=(−3−(−0.4)−0.2)/0.8=−2.8/0.8=−3.5 is obtained by using equation 2. That is, power setting section 107 controls transmission power by calculating the amount of power adjustment which takes into account residual error E2, gain linearity Gact, and comparison standard value error dREF in step ST37, and by setting this amount of power adjustment (that is, setting scaling coefficients S10 and S11 corresponding to this amount of power adjustment) in step ST38.

As a result, as shown in FIG. 11, PA 103 can accurately adjust output power of PA 103 to the target power (4 dBm) in the end. Therefore, by using transmission power control of the present embodiment, it is possible to realize accurate transmission power control that does not develop an error due to changes of gain linearity and errors of comparison standard value.

(3) CONFIGURATION EXAMPLE OF TRANSMISSION POWER CONTROL SECTION

Next, a specific configuration example of transmission power control section 107 to realize transmission power control of the present embodiment will be presented.

(3-1) Configuration Example 1

Figure 13:
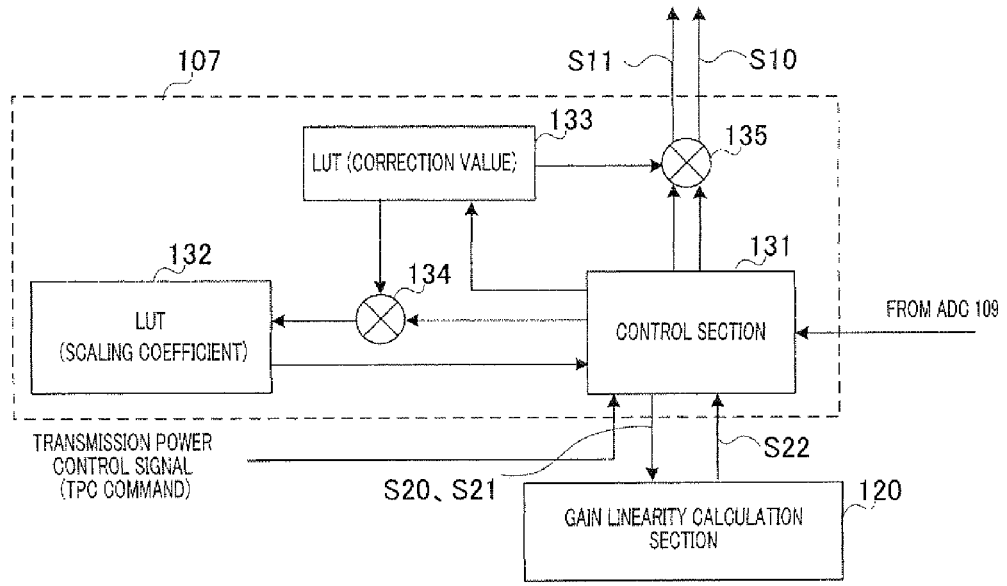
FIG. 13 is a block diagram showing the configuration example of a transmission power control section.

FIG. 13 shows configuration example 1 of transmission power control section 107. Transmission power control section 107 in FIG. 13 has control section 131, look-up table (LUT) 132 in which scaling coefficients are stored, look-up table (LUT) 133 in which correction values are stored, and multipliers 134 and 135. The function of power setting section 107-1 in FIG. 3 can be realized by control section 131, look-up tables 132 and 133, and multipliers 134 and 135. Also, the function of error calculation section 107-2 in FIG. 3 can be realized by control section 131.

Control section 131 receives as input the output of ADC 109 and transmission power control signal. Control section 131 generates a read address of LUT 132 based on the output of ADC 109 and a transmission power control signal, and outputs it to multiplier 134.

A scaling coefficient corresponding to a read address which is input from control section 131 through multiplier 134 is read from LUT 132, and this scaling coefficient is transmitted to control section 131.

From control section 131 to gain linearity calculation section 120, power adjustment amount S20 and power change amount S21 are output. Gain linearity calculation section 120 calculates gain linearity S22 based on the amount of power adjustment and the amount of power change, and transmits it to control section 131. Thus, step ST36 process in FIG. 12 is performed.

Control section 131 calculates the amount of power adjustment, based on gain linearity S22 input from gain linearity calculation section 120, and the power measurement value input from ADC 109. Thus, step ST37 process in FIG. 12 is performed. Specifically, control section 131 outputs the calculated gain linearity error to LUT 133. LUT 133 outputs correction values (correction coefficients) corresponding to the gain linearity error to multipliers 134 and 135. Therefore, a scaling coefficient output from LUT 133 and scaling coefficient output from control section 131 are corrected, so that output power of PA 103 is adjusted. This process equals step ST26 process in FIG. 12. Although configuration example in FIG. 13 shows a case where multipliers 134 and 135 are provided and where both a scaling coefficient output from LUT 133 and a scaling coefficient output from control section 131 are corrected, it is equally possible to provide only one of multipliers 134 and 135 and correct only one of a scaling coefficient output from LUT 133 and a scaling coefficient output from control section 131.

(3-2) Configuration Example 2

Figure 14:
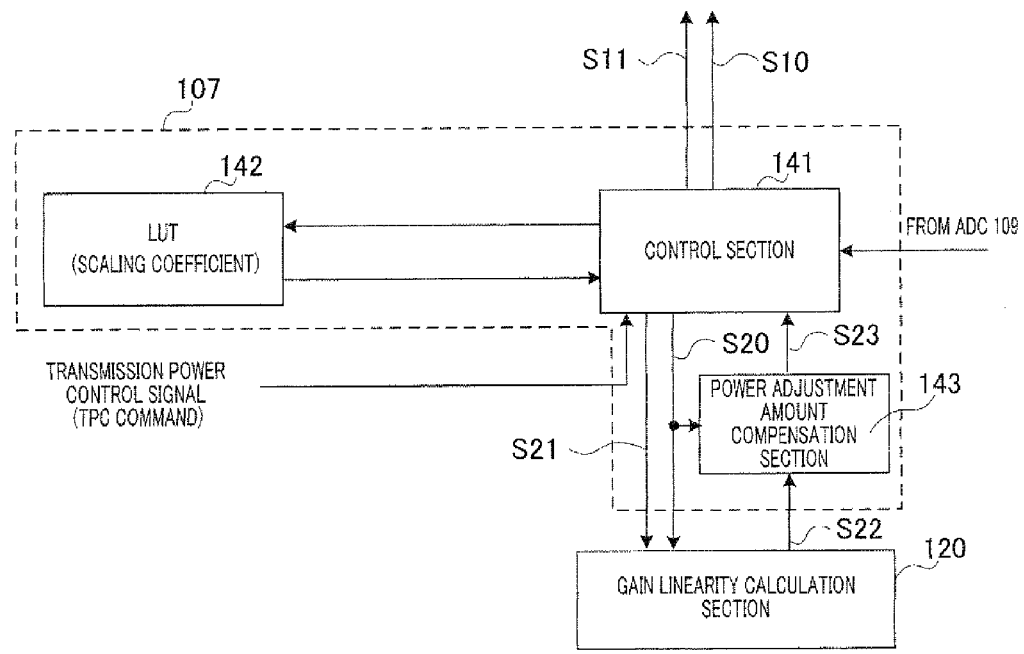
FIG. 14 is a block diagram showing the configuration example of a transmission power control section.

FIG. 14 shows configuration example 2 of transmission power control section 107. Transmission power control section 107 in FIG. 14 has control section 141, look-up table (LUT) 142 in which scaling coefficients are stored, and power adjustment amount compensation section 143. The function of power setting section 107-1 in FIG. 3 can be realized by control section 141, look-up table 142, and power adjustment amount compensation section 143. Also, the function of error calculation section 107-2 in FIG. 3 can be realized by control section 141 and power adjustment amount compensation section 143.

Control section 141 receives as input the output of ADC 109 and transmission power control signal. Control section 141 generates a read address of LUT 142 based on the output of ADC 109 and a transmission power control signal, and outputs it to LUT 142. A scaling coefficient corresponding to a read address is read from LUT 142, and this scaling coefficient is transmitted to control section 141.

From control section 141 to gain linearity calculation section 120, power adjustment amount S20 and power change amount S21 are output. Gain linearity calculation section 120 calculates gain linearity S22 based on power adjustment amount S20 and power change amount S21. Thus, step ST24 process in FIG. 12 is performed.

Power adjustment amount compensation section 143 receives as input gain linearity S22 from gain linearity calculation section 120, at the same time, receives as input power adjustment amount S20 from control section 141, adjusts power adjustment amount S20 based on them, and outputs corrected power adjustment amount S23 to control section 141. This process equals step ST25 process in FIG. 12.

Control section 141 generates a read address of LUT 142 based on corrected power adjustment amount S23, and retrieves a scaling coefficient from LUT 142. This process equals step ST26 process in FIG. 12.

(3-3) Configuration Example 3

Figure 15:
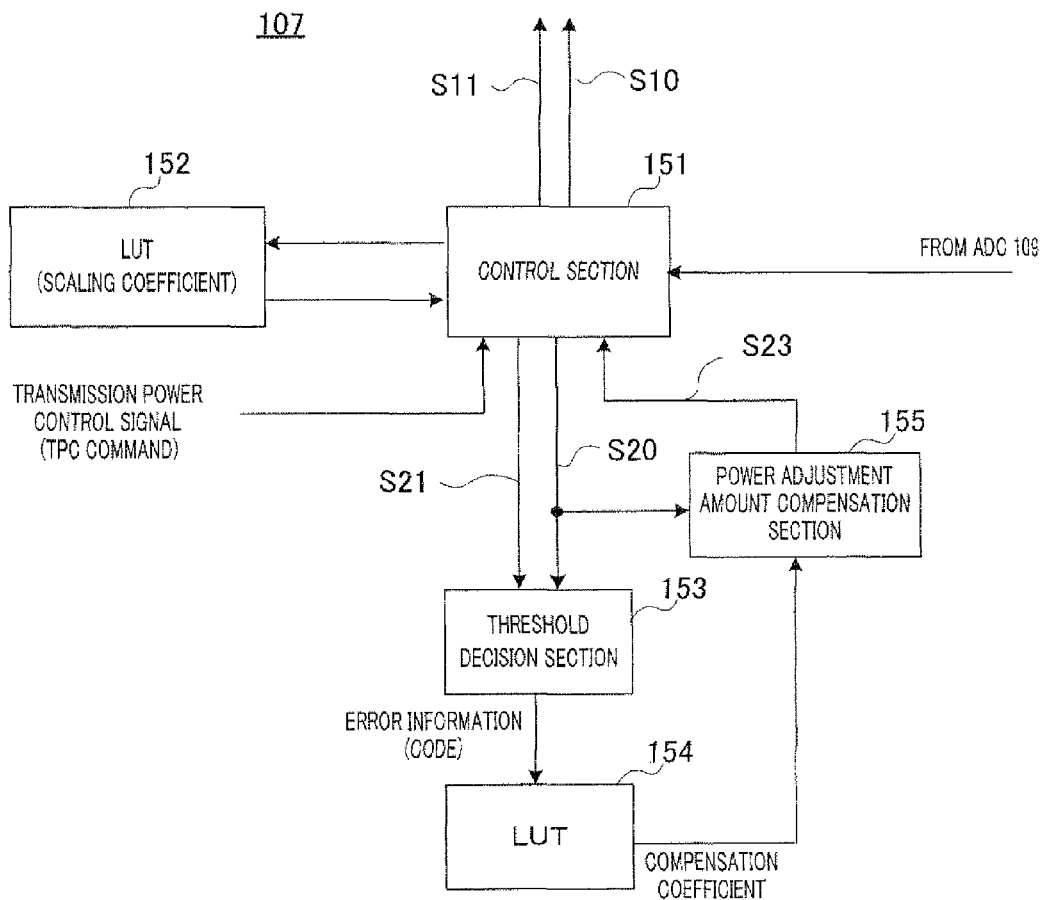
FIG. 15 is a block diagram showing the configuration example of a transmission power control section.

FIG. 15 shows configuration example 3 of transmission power control section 107. Transmission power control section 107 in FIG. 15 has control section 151, look-up table (LUT) 152 in which scaling coefficients are stored, threshold decision section 153, look-up table (LUT) 154 in which correction values are stored, and power adjustment amount compensation section 155.

Control section 151 receives as input the output of ADC 109 and transmission power control signal. Control section 151 generates a read address of LUT 152 based on the output of ADC 109 and a transmission power control signal, and outputs it to LUT 152. A scaling coefficient corresponding to a read address is read from LUT 152, and this scaling coefficient is transmitted to control section 151.

From control section 151 to threshold decision section 153, power adjustment amount S20 and power change amount S21 are output. Threshold decision section 153 calculates an error of power change amount S21 from power adjustment amount S20, based on power adjustment amount S20 and power change amount S21, and compares this error against threshold decision. Threshold decision section 153 compares the absolute value of the error with a predetermined threshold, and outputs this comparison result. In an example of FIG. 15, threshold decision section 153 uses one threshold, and outputs error information that shows whether or not an error is greater than a threshold and whether the error is positive or negative. For example, threshold decision section 153 outputs "1" as error information when the absolute value of the error is greater than the threshold and the error is positive, outputs "−1" as error information when the absolute value of an error is greater than the threshold and the error is negative, and outputs "0" as error information when the absolute value of the error is lower than the threshold.

In LUT 154, a compensation coefficient corresponding to each error information is stored, and a compensation coefficient according to error information is output to power adjustment amount compensation section 155. Specifically, LUT 154 outputs the first compensation coefficient when receiving as input the error information that the absolute value of an error is greater than the threshold and the error is positive, outputs the second compensation coefficient when receiving as input error information that the absolute value of an error is greater than the threshold and the error is negative, and outputs 1 (that is, an error is small, so that compensation is not performed) when receiving as input error information that the absolute value of an error is lower than the threshold. Here, it is determined as 0<first compensation coefficient<1<second compensation coefficient.

Power adjustment amount compensation section 155 receives as input power adjustment amount S20 and a compensation coefficient, calculates corrected power adjustment amount S23 by multiplying power adjustment amount S20 by a compensation coefficient, and outputs the result to control section 151. Control section 151 generates a read address of LUT 152 based on corrected power adjustment amount S23, and retrieves a scaling coefficient from LUT 152. This process equals step ST26 process in FIG. 12.

Although this example uses one threshold but is not limited to this, it is equally possible to use a plurality of thresholds and to have a plurality of compensation coefficients corresponding to those thresholds. Therefore, as the error of power change amount S21 from power adjustment amount S20 becomes larger, power adjustment amount S21 is corrected more by power adjustment amount compensation section 155. Also, by providing finer thresholds, it is possible to use more accurate compensation coefficient, so that compensation of power adjustment amount S21 can be performed precisely.

FIG. 15 shows a configuration that compensates an error due to gain linearity by threshold decision section 153, LUT 154 and power adjustment amount compensation section 155 in a simple manner. The configuration of FIG. 15 can substantially compensate the error due to gain linearity even without having gain linearity calculation section 120, providing a simpler configuration than the configurations of FIG. 13 and FIG. 14.

(4) CONCLUSION

As mentioned above, the transmission power control method of the present embodiment includes providing the power setting value of a mode to switch to, such that an inter-mode output power error is canceled (equal to step ST21), measuring an intra-mode output power error from the power setting value of a mode to switch to (equal to step ST23), measuring the value of gain linearity based on the power setting value of a mode to switch to and the above mentioned an intra-mode output power error (equal to step ST24), and resetting the power setting value of a mode to switch to (equal to steps ST25 and 26).

Transmission power control method of the present embodiment may be paraphrased as below. Thus, a transmission power control method of the present embodiment includes the steps of setting the first and second power setting values that are the power setting values in a mode before switching (equal to step ST31), measuring the first and second power measurement values that are the output power measurement values of the power amplifier when the first and second power setting values are set (equal to step ST2), calculating the drift of the second power measurement value from the second power setting value as a comparison standard value error (equal to step ST32), setting a third power setting value that is the power setting value in a mode to switch to and measuring a third power measurement value that is the output power measurement value of the power amplifier when a third power setting value is set (equal to step ST3 and 4), measuring an inter-mode output power error based on the second and third power measurement values (equal to step ST5), setting a fourth power setting value that is a value to cancel the inter-mode output power error and measuring a fourth power measurement value that is the output power measurement value of the power amplifier when a fourth power setting value is set (equal to steps ST33 and 34), measuring an intra-mode output power error from the power setting value in the mode to switch to based on the third and fourth power setting values and the third and fourth power measurement values (equal to step ST35), measuring a gain linearity value based on the third and fourth power setting values and the intra-mode output power error (equal to step ST36) and setting a fifth power setting value based on a target power, the intra-mode output power error, the comparison standard value error, and the gain linearity value (equal to steps ST37 and 38).

According to a transmission power control method and apparatus of the present embodiment, it is possible to precisely adjust the output power to the target power, even when, by resetting a power setting value that cancels an output power error due to drift of intra-mode gain linearity of a mode to switch to, after setting the power setting value that cancels an inter-mode output power error, an inter-mode output power error from the power setting value, and an intra-mode output power error from the power setting value is produced in a complex manner.

In addition, a transmission power control method and apparatus of the present invention can more precisely adjust output power to the target power, by resetting the power setting value in the mode to switch to that cancels an intra-mode output power error from the power setting value in the mode before switching, and a comparison standard value error.

Although the above embodiments have explained a case where the present invention is applied to transmission apparatus 100 which performs a polar modulation, the applicability of the present invention is not limited to this. Thus, the above embodiments have explained a case where an amplitude component signal for which amplitude control has been performed is input to a power supply signal input port of PA 103 and at the same time a phase-modulated signal is input to a signal input port of PA 103, but is not limited to this. For example, as a quadrature modulation, even if a DC voltage (constant voltage) is supplied to a power supply signal input port of PA 103 and at the same time a signal that is performed a line type modulation is input to a signal input port of PA 103, the same advantage result can be achieved as the above.

The disclosure of Japanese Patent Application No. 2009-281710, filed on Dec. 11, 2009, including the specification, drawings and abstract, is incorporated herein by reference in its entirety.

INDUSTRIAL APPLICABILITY

When having a control process to switch power amplifier mode between a compressed mode and an uncompressed mode, a transmission power control method and apparatus of the present invention have an effect of enabling accurate adjustment of output power of power amplifier to the target power, and are suitable to use for a portable radio device.

REFERENCE SIGNS LIST

100 TRANSMISSION APPARATUS
101 POLAR SIGNAL GENERATION CIRCUIT
102 PHASE-MODULATED SIGNAL GENERATION CIRCUIT
103 POWER AMPLIFIER (PA)
104 AMPLITUDE CONTROL CIRCUIT
105 VARIABLE AMPLIFICATION CIRCUIT
106 DETECTOR CIRCUIT
107 TRANSMISSION POWER CONTROL SECTION
107-1 POWER SETTING SECTION
107-2 ERROR CALCULATION SECTION
108 LOW-PASS FILTER (LPF)
109 ANALOGUE-TO-DIGITAL CONVERTER (ADC)
110 SPREADING MODULATING SECTION
111 POWER ALIGNMENT LOOP (PAL)
120 GAIN LINEARITY CALCULATION SECTION
S10, S11 SCALING COEFFICIENT
S20 POWER ADJUSTMENT AMOUNT
S21 POWER CHANGE AMOUNT
S22 GAIN LINEARITY
S23 CORRECTED POWER ADJUSTMENT AMOUNT

The invention claimed is:

1. A transmission power control method including a process of switching a mode of a power amplifier between a compressed mode and an uncompressed mode in a process of controlling output power of the power amplifier, the method comprising:
calculating an intra-mode output power error from a power setting value of the mode before switching, as a comparison standard value error;
setting the power setting value of a mode to switch to, such that an inter-mode output power error is canceled;
calculating the intra-mode output power error from the power setting value of the mode to switch to;
calculating a gain linearity value based on the power setting value of the mode to switch to and the intra-mode output power error; and
resetting the power setting value in the mode to switch to that cancels, based on the gain linearity value, the comparison standard value error in the mode before switching and the output power error in the mode to switch to.

2. A transmission power control method including a process of switching a mode of a power amplifier between a compressed mode and an uncompressed mode in a process of controlling output power of the power amplifier, the method comprising the steps of:
setting first and second power setting values that are power setting values in a mode before switching, measuring first and second power measurement values that are output power measurement values of the power amplifier when the first and second power setting values are set, and measuring a drift of the second power measurement value for the second power setting value as a comparison standard value error;
setting a third power setting value that is a power setting value in a mode to switch to and measuring a third power measurement value that is an output power measurement value of the power amplifier when a third power setting value is set;
measuring an inter-mode output power error based on the second and third power measurement values;
setting a fourth power setting value that is a value to cancel the inter-mode output power error and measuring a fourth power measurement value that is the output power measurement value of the power amplifier when a fourth power setting value is set;
measuring an intra-mode output power error from the power setting value in the mode to switch to based on the third and fourth power setting values and the third and fourth power measurement values;
measuring a gain linearity value based on the third and fourth power setting values and the intra-mode output power error; and
setting a fifth power setting value based on a target power, the intra-mode output power error, the comparison standard value error, and the gain linearity value.

3. The transmission power control method according to claim 2, wherein the gain linearity value is calculated by using a difference between the third power setting value and the fourth power setting value, and the intra-mode output power error.

4. A transmission power control apparatus that switches a power amplifier between a compressed mode and an uncompressed mode and controls transmission power, the apparatus comprising:
a power setting section that sets output power of the power amplifier;
a power measurement section that measures output power of the power amplifier;
an error calculation section that measures an error of an output power measurement value from a power setting value based on the power setting value set by the power setting section and the output power measurement value measured by the power measurement section; and
a gain linearity calculation section that calculates a gain linearity value, wherein:
the power setting section sets first and second power setting values that are the power setting values of a mode before switching and a third power setting value that is the power setting value of a mode to switch to;
the power measurement section measures a first power measurement value that is the output power measurement value of the power amplifier when the first power setting value is set, a second power measurement value that is the output power measurement value of the power amplifier when the second power setting value is set, and a third power measurement value that is the output power measurement value of the power amplifier when the third power setting value is set;
the error calculation section measures an intra-mode output power error from the power setting value in the mode before switching as a comparison standard value error based on the first and second power measurement values and measures an inter-mode output power error from the power setting value based on the second and third power measurement values;

the power setting section sets a fourth power setting value that is a value to cancel the inter-mode output power error;

the power measurement section measures a fourth power measurement value that is the output power measurement value of the power amplifier when the fourth power setting value is set;

the error calculation section measures the intra-mode output power error from the power setting value in the mode to switch to based on the third and fourth power setting values and the third and fourth power measurement values;

the gain linearity calculation section measures the gain linearity value based on the third and fourth power setting values and the intra-mode output power error; and the power setting section sets a fifth power setting value based on a target power, the intra-mode output power error, the comparison standard value error, and the gain linearity value.

5. The transmission power control method according to claim 4, wherein the gain linearity calculation section calculates the gain linearity value by using a difference between the third power setting value and the fourth power setting value, and the intra-mode output power error.

* * * * *